(12) United States Patent
Postolov et al.

(10) Patent No.: US 10,042,974 B2
(45) Date of Patent: Aug. 7, 2018

(54) INSPECTING A WAFER USING IMAGE AND DESIGN INFORMATION

(71) Applicants: Yuri Postolov, Afula (IL); Menachem Regensburger, Shimshit (IL)

(72) Inventors: Yuri Postolov, Afula (IL); Menachem Regensburger, Shimshit (IL)

(73) Assignee: CAMTEK LTD., Migdal Haemeq (IL)

( * ) Notice: Subject to any disclaimer, the term of this patent is extended or adjusted under 35 U.S.C. 154(b) by 32 days.

(21) Appl. No.: 15/456,531

(22) Filed: Mar. 12, 2017

(65) Prior Publication Data
US 2017/0344697 A1 Nov. 30, 2017

Related U.S. Application Data

(60) Provisional application No. 62/343,021, filed on May 30, 2016.

(51) Int. Cl.
*G06F 17/50* (2006.01)
*G06F 11/22* (2006.01)

(52) U.S. Cl.
CPC ...... *G06F 17/5081* (2013.01); *G06F 2217/14* (2013.01)

(58) Field of Classification Search
CPC .................................................. G06F 17/5081
USPC .......................................................... 716/136
See application file for complete search history.

(56) References Cited

U.S. PATENT DOCUMENTS

| | | | | |
|---|---|---|---|---|
| 9,543,224 B1 * | 1/2017 | Meyer | ...................... | H01L 22/20 |
| 2011/0249111 A1 * | 10/2011 | Weiss | ...................... | H01L 22/12 |
| | | | | 348/87 |
| 2016/0141213 A1 * | 5/2016 | Bishop | ................... | H01L 24/73 |
| | | | | 438/16 |

* cited by examiner

*Primary Examiner* — Suresh Memula
(74) *Attorney, Agent, or Firm* — Reches Patents

(57) ABSTRACT

A method for inspecting a group of dies of a wafer, wherein the wafer comprises a group of wafer segments, wherein each wafer segment comprises a die of the group of dies, a molded material that surrounds the die and redistribution layer (RDL) conductors that are coupled to the die and are positioned above the die and the molded material, wherein the method includes the steps of: receiving design information about the RDL conductors of each wafer segment of the group of wafer segments; obtaining, during a setup process, first images of the group of wafer segments; wherein the obtaining of the first images comprises illuminating the group of wafer segments with radiation and detecting radiation scattered or reflected from the group of wafer segments as a result of the illuminating; generating reference information based on the design information about the RDL conductors of one or more wafer segments of the group of wafer segments and at least one first image of the one or more first images; acquiring, during an inspection process, a second image of each wafer segment of the group of wafer segments; and evaluating each wafer segment of the group of wafer segments based on the second image of the wafer segment and the reference information of the wafer segment.

19 Claims, 9 Drawing Sheets

INSPECTING A WAFER USING IMAGE AND DESIGN INFORMATION

CROSS REFERENCE TO RELATED APPLICATIONS

This application claims the priority of U.S. provisional patent Ser. No. 62/343,021 filing date May 30, 2016 which is incorporated herein by reference.

BACKGROUND OF THE INVENTION

As the world pushes further to smaller cheaper and faster devices, the microelectronics industry pushed the limits of the technology. A large number of technologies aroused as an answer to the growing challenge, and the back-end of the line is no exception.

The gradual adaptation of new technologies in the back-end, was replaced by a variety of new packaging methods. These methods tackle the obstacles in a range of approaches.

One of the promising approaches is the "Fan Out" approach. This approach, besides solving the need for increased I/O for the manufactured dice, enables the reduction of manufacturing costs as it requires less of the expensive silicon area.

The fan-out technology has unique requirements that should be met in a low price.

The Wafer Level Fan Out (WLFO) Technology

Referring to FIG. 1—the fundamental WLFO technology is a 2D configuration, based on embedding dies (12 and 13) into a molded wafer (molded material 11), also called "wafer reconstitution." The molded wafer is processed through a standard WLP flow to create the final IC assembly structure (see FIG. 1). The active surface of the die is coplanar with the mold compound, allowing for the "fan-out" of redistribution layer (RDL) conductors (14, 15, 16 and 17) such as conductive copper traces and solder ball pads into the molded area using conventional RDL processing. Bumps 18, 19, 20 and 21 are then manufactured the solder ball pads.

SUMMARY

There may be provided a method for inspecting a group of dies of a wafer, wherein the wafer may include a group of wafer segments, wherein each wafer segment may include a die of the group of dies, a molded material that surrounds the die and redistribution layer (RDL) conductors that are coupled to the die and are positioned above the die and the molded material, wherein the method may include the steps of: receiving design information about the RDL conductors of each wafer segment of the group of wafer segments; obtaining, during a setup process, first images of the group of wafer segments; wherein the obtaining of the first images may include illuminating the group of wafer segments with radiation and detecting radiation scattered or reflected from the group of wafer segments as a result of the illuminating; generating reference information based on the design information about the RDL conductors of one or more wafer segments of the group of wafer segments and at least one first image of the one or more first images; acquiring, during an inspection process, a second image of each wafer segment of the group of wafer segments; and evaluating each wafer segment of the group of wafer segments based on the second image of the wafer segment and the reference information of the wafer segment.

The method may include generating separate reference information for each wafer segment.

The method may include generating a single reference information for all wafer segments.

The method may include generating a separate reference information for each sub-group of wafer segment.

The evaluating may include selecting inspection parameters based on the design information about the RDL conductors of the wafer segment.

The evaluating may include selecting a defect detection algorithm based on the design information about the RDL conductors of the wafer segment.

The evaluating may include comparing between a second image of the wafer segment and the reference information of the wafer segment.

The method may include processing the first images to determine an orientation of each die of the group of dies.

The generating of the reference information is responsive to the orientation of the die of the wafer segment of each wafer segment.

There may be provided an inspection system for inspecting a group of dies of a wafer, wherein the wafer may include a group of wafer segments, wherein each wafer segment may include a die of the group of dies, a molded material that surrounds the die and redistribution layer (RDL) conductors that are coupled to the die and are positioned above the die and the molded material, wherein the inspection system may include: a design information unit for receiving design information about the RDL conductors of each wafer segment of the group of wafer segments; an imaging device that is configured to obtain, during a setup process, first images of the group of wafer segments; wherein the obtaining of the first images may include illuminating the group of wafer segments with radiation and detecting radiation scattered or reflected from the group of wafer segments as a result of the illuminating; a processing system that is configured to generate reference information based on the design information about the RDL conductors of one or more wafer segments of the group of wafer segments and at least one first image of the one or more first images; wherein the imaging device is further configured to acquire, during an inspection process, second images of the group of wafer segments; and wherein the processing system is further configured to evaluate each wafer segment of the group of wafer segments based on the second image of the wafer segment and the reference information of the wafer segment There may be provided a non-transitory computer readable medium may store instructions that once executed by an inspection system causes the inspection system to inspect a group of dies of a wafer, wherein the wafer may include a group of wafer segments, wherein each wafer segment may include a die of the group of dies, a molded material that surrounds the die and redistribution layer (RDL) conductors that are coupled to the die and are positioned above the die and the molded material, by executing the steps of: receiving design information about the RDL conductors of each wafer segment of the group of wafer segments; obtaining, during a setup process, first images of the group of wafer segments; wherein the obtaining of the first images may include illuminating the group of wafer segments with radiation and detecting radiation scattered or reflected from the group of wafer segments as a result of the illuminating; generating reference information based on the design information about the RDL conductors of one or more wafer segments of the group of wafer segments and at least one first image of the one or more first images; acquiring, during an inspection process, a second image of each wafer segment of the group of wafer segments; and evaluating each wafer segment of the group of wafer segments based on the second image of the wafer segment and the reference information of the wafer segment.

The non-transitory computer readable medium may store instructions for generating separate reference information for each wafer segment.

The non-transitory computer readable medium may store instructions for generating a single reference information for all wafer segments.

The non-transitory computer readable medium may store instructions for generating a separate reference information for each sub-group of wafer segment.

The evaluating may include selecting inspection parameters based on the design information about the RDL conductors of the wafer segment.

The evaluating may include selecting a defect detection algorithm based on the design information about the RDL conductors of the wafer segment.

The evaluating may include comparing between a second image of the wafer segment and the reference information of the wafer segment.

The non-transitory computer readable medium may store instructions for processing the first images to determine an orientation of each die of the group of dies.

The generating of the reference information is responsive to the orientation of the die of the wafer segment of each wafer segment.

BRIEF DESCRIPTION OF THE INVENTION

The present invention will be understood and appreciated more fully from the following detailed description taken in conjunction with the drawings.

DETAILED DESCRIPTION OF THE INVENTION

Because the apparatus implementing the present invention is, for the most part, composed of optical components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

Figure 2:
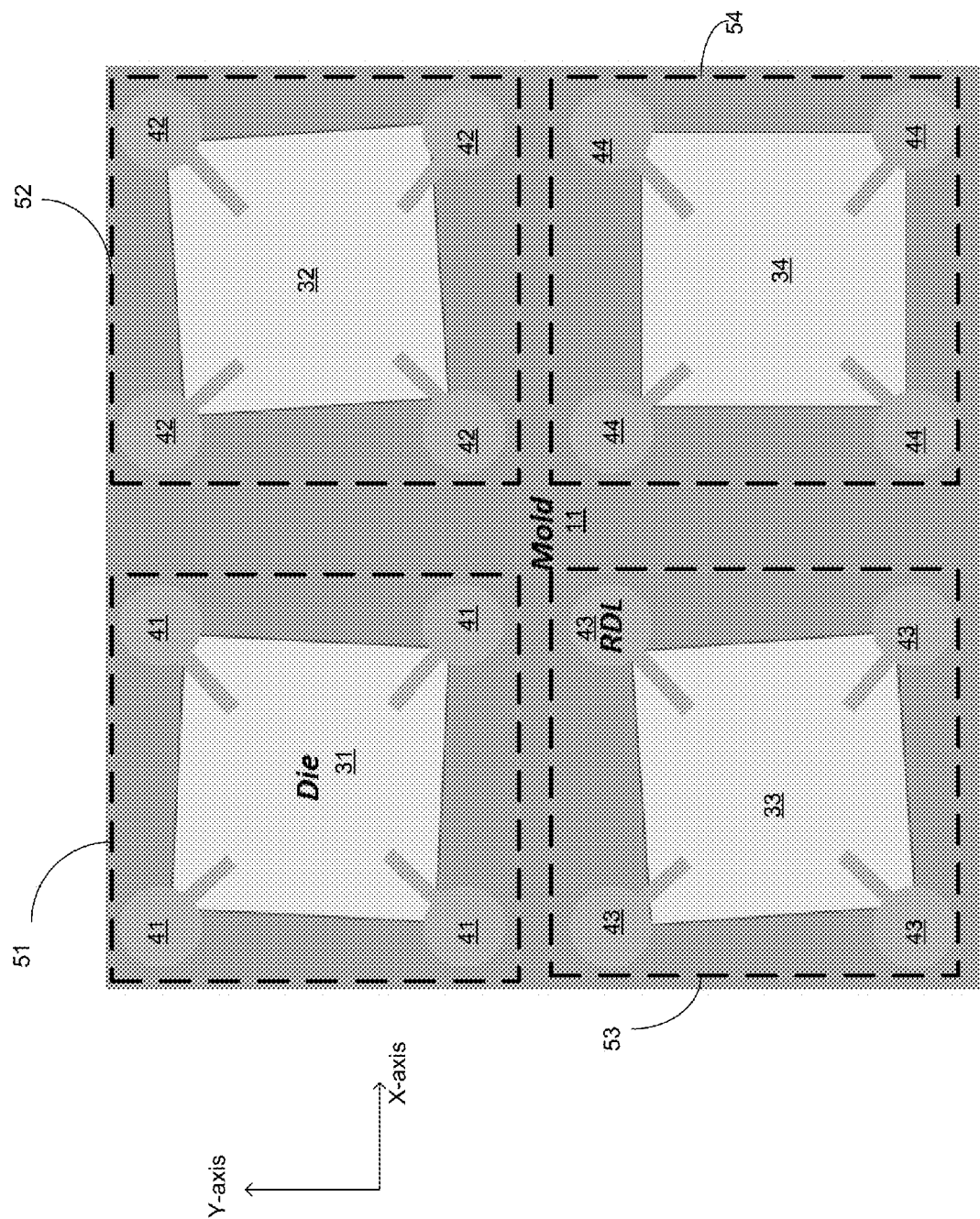
FIG. 2 illustrates a fan out RDL inspection according to an embodiment of the invention.

FIG. 2 illustrates four wafer segments 51, 52, 53 and 54. Each wafer segments includes a die (31, 32, 33 and 34) that is surrounded by molded material 11 and there are multiple RDL conductors (41, 42, 43 and 44) that are coupled to the die and are positioned above the die and the molded material.

FIG. 2 illustrates the dies is misaligned with a X-Y coordinate system. Each die has its own alignment and is coupled to its own RDL conductors. The RDL conductors of different dies may differ from each other or may be equal to each other.

The WLFO process has some unique features that require particular control stages, combined with the standard back-end inspection stages.

That includes:
  a. pattern wafer—standard 2d Inspection.
  b. dicing—Kerf inspection, cracks, chipping
  c. wafer reconstitution—alignment of dice (metrology), cracks and imperfections in the molded material (mold).
  d. metal RDL—shorts, cuts and connections.
  e. bumping—height and co-planarity.

The misalignment between the die and the RDL layers create a unique challenge for the WLFO process. As each die includes a unique construction of the alignment between the two—a single reference is impossible to generate. Inspection of reconstructed wafer during the RDL process poses a unique challenge as the RDL layer and the die locations vary from die to die. The ability to distinguish between the two layers is important in order to define a good reference for each "reconstructed die" (Litho and RDL).

In order to separate between the two overlays one can identify the RDL layer by the computer aided design (CAD) information of the RDL process. The die information is trained based on the image during the setup process.

An appropriate algorithm is set for each layer (RDL and litho) to ensure optimal detection on both layers.

There may be provided a method and a system that can distinguish between the two overlays and optimize the scan. Moreover, the setup becomes easier and faster as a large amount of the information can be extracted for the imported CAD information.

System Structure.

Figure 3:
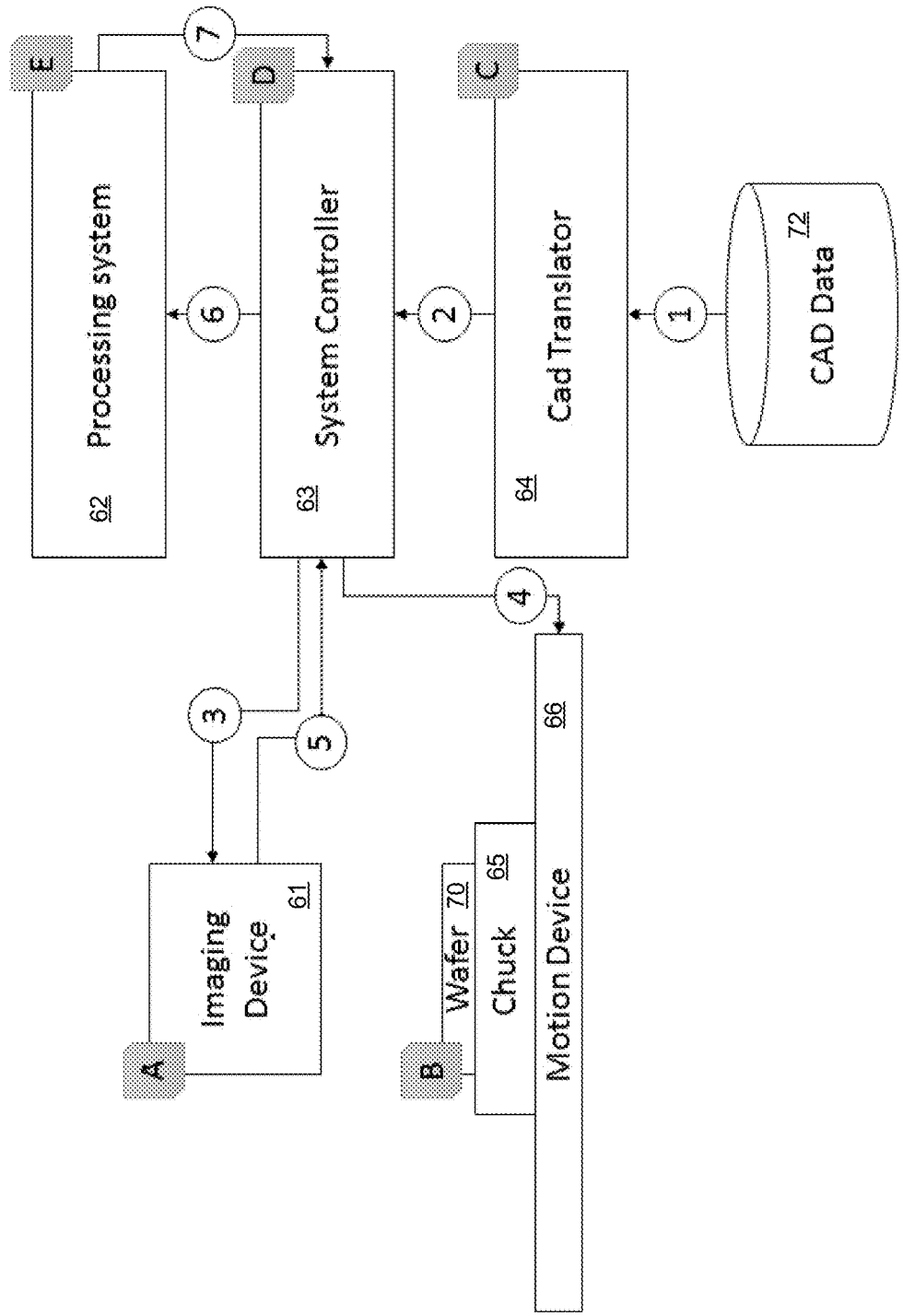
FIG. 3 illustrates an inspection system according to an embodiment of the invention.

FIG. 3 illustrates an inspection system 60 and a wafer 70 according to an embodiment of the invention.

The inspection system 60 may include a CAD database ("CAD data") 72 or be coupled to the CAD database.

The inspection system may include:
  a. An imaging device 61—this imaging device can capture images of the moving wafer underneath it. The imaging device may include a number of components such as camera, illumination and optics that are required for the image capture operation. The imaging device 61 may include one or more sensors, one or more lenses, one or more radiation source.
  b. A wafer movement system—that may include
    i. Wafer chuck ("chuck") 65—for holding the wafer while moving.
    ii. A motion device 66 that can move the chuck (which holds the wafer) according to desired route, under the imaging device.
  c. CAD translator 64—this component handles the translation of the FAB's design data into a format which is readable to the system. This translation process may include Rules for the generation of the reference information.

d. System controller 63—this component manages the whole scanning and setup flow as it
   i. Accepts the information from the different sources (user, FAB) and creates the information for the setup or the scan flow.
   ii. Manages the inspection sequence.
e. Processing system 62—responsible to compare the scanned wafer to the reference information and report defects or metrological data.

The system controller and the processing systems may include one or more computers, one or more hardware processors and/or hardware controller chips and/or hardware accelerators that are configured, by being programmed with dedicated software/firmware and/or middleware to perform the method illustrated in this application.

In this system CAD information is loaded (①) by the CAD translator 64 and transferred (②) to the system controller 63 in a required format.

In order to gather the visual information the system controller 63 sets (③) the imaging device 61 and (④) the motion device 66 and activates them.

During setup the system controller 63 adds (⑤) user information and visual data grabbed by the system in order to generate the reference information required to the scanning process. During scanning the processing system 62 compares (⑥) the reference information to the captured wafer information in the processing system.

The processing system 66 sends (⑦) the result information to the system controller 63 for storage and reporting.

System Operation

The operation of the inspection system 60 requires a setup phase prior to the inspection. In the setup phase, the parameters for the Inspection phase are set. These parameters may include the illumination parameters, the pixel size and other parameters that correspond to the imaging process, and other parameters such as acceptance thresholds for the processing.

Figure 4:
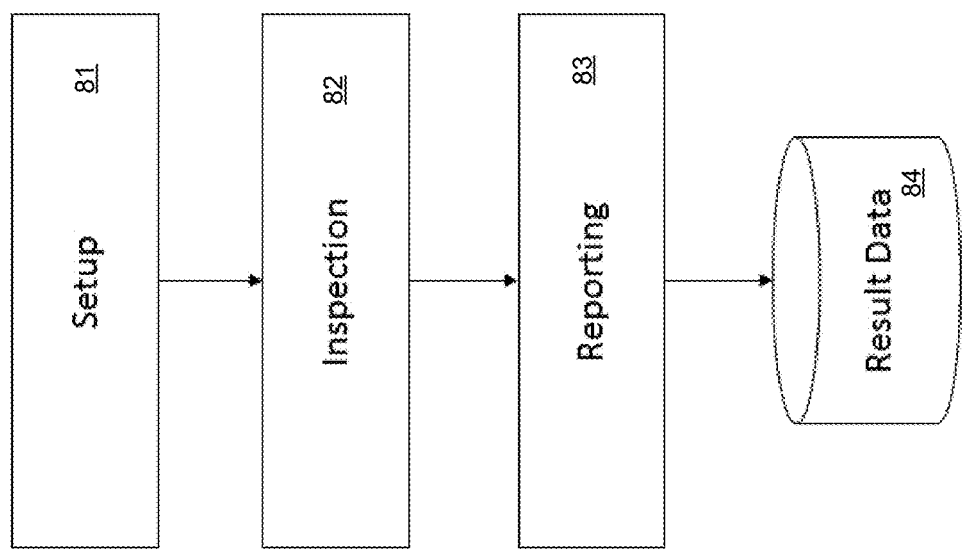
FIG. 4 illustrates general operation steps according to an embodiment of the invention.

Referring to FIG. 4—most AOI system requires a setup phase (81) prior to the Inspection (82). After the Inspection is done and defects are generated the system reports (63) the data to the factory database (result data 84). The setup process defines the way the inspection is done and so governs the quality of the data that is generated by the equipment.

In order to scan the wafer the system should have the following
a. Imaging parameters—how to get the image information during the scan setup.
b. Inspection parameters—how to get the result data during inspection.
c. Reference information—this information defined what the die should look like (some machines that use die to die comparison would not necessarily use this information).

Figure 5:
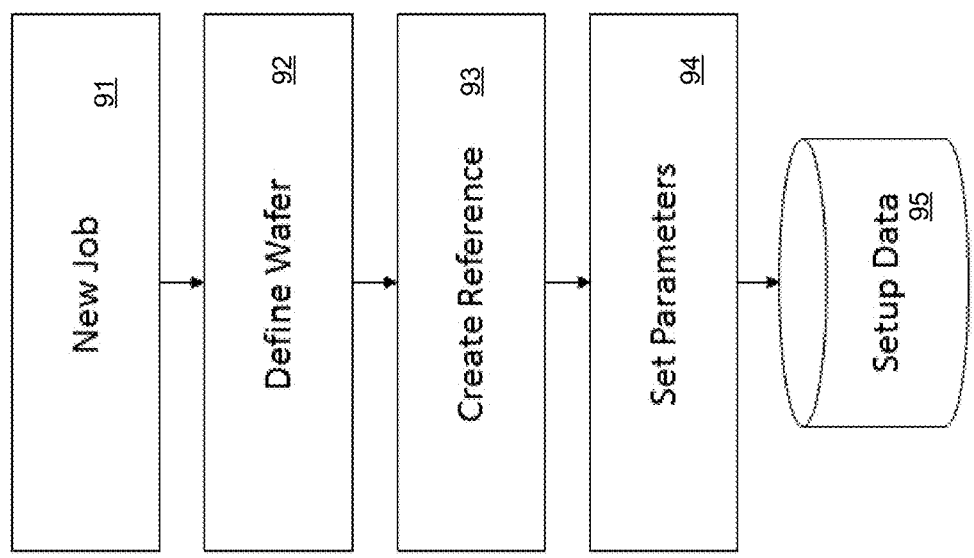
FIG. 5 illustrates the setup flow according to an embodiment of the invention.

Referring to FIG. 5—in the setup process (90) the system defines administrative information such as recipe name and the handling information prior to the definition of the wafer information definition stage, in which the wafer is described (Die Size, Die distribution . . . ). The setup process may include initiating a new job 91, defining a wafer 92, creating a reference 93, setting parameters 94 of inspection to provide setup data 95.

In the create reference stage a definition of good die is defined.

According to the wafer specification the inspection parameters are set.

In the WLFO process, the reference image for each die is unique as the die information may be shifted with respect to the RDL process. A traditional solution for this issue is to reduce the sensitivity of one layer (for instance the embedded die) so that a false alarm will not be generated, this results in limited detectability in this layer The suggested solution specifies a mechanism for separating the two layers in an efficient way that not only allows an easier and more robust setup process, but also enables the system to adapt to changes in the design of the RDL process (this can be done in the Die Level).

Figure 6:
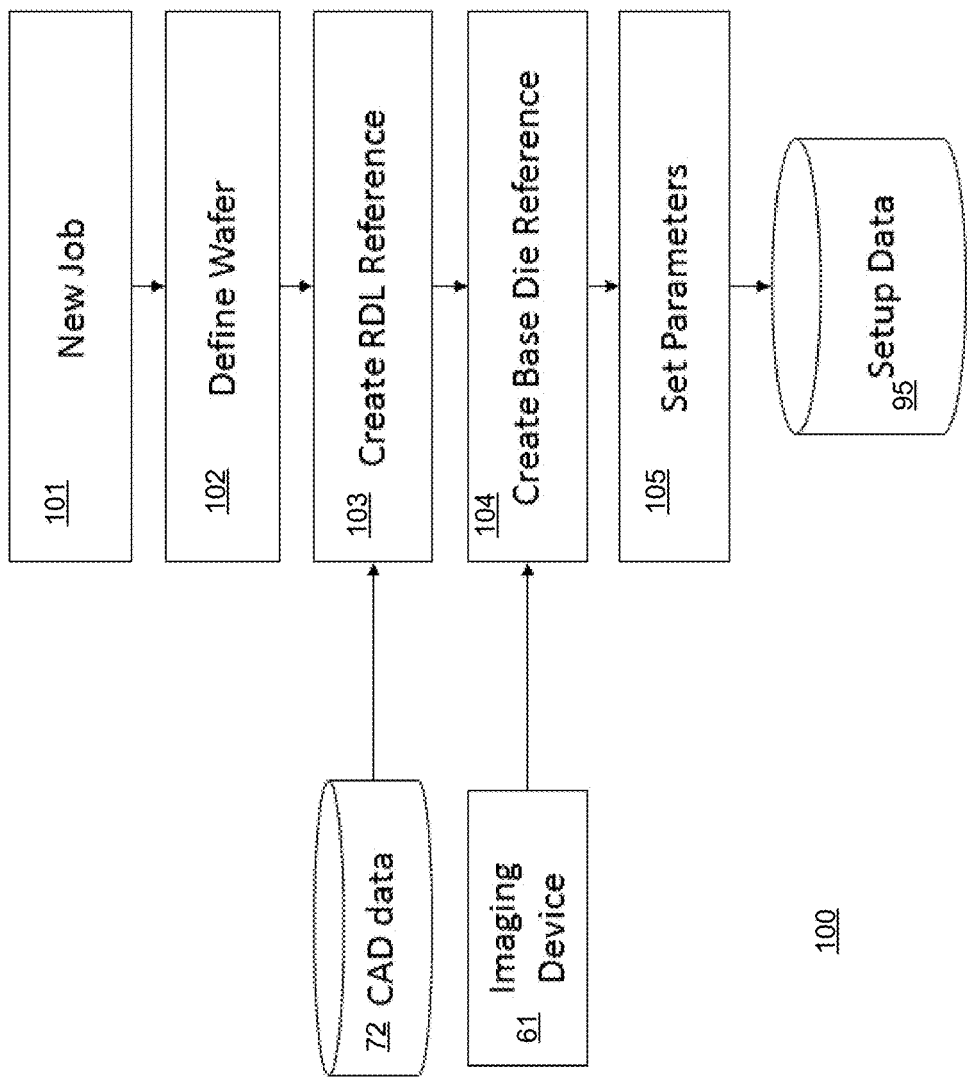
FIG. 6 illustrates a multi-layer reference generation inspection according to an embodiment of the invention.

Referring to FIG. 6—during a multi-layer setup (100) both CAD data (72) and image data from imaging device 61 are utilized. The ability to define the different roles (RDL/Base) is important to enable correct interpretation of the scanned wafer. The multi-layer setup 100 may include defining a new job 101. Defining a wafer 102, creating (based on CAD data 71) RDL reference information 103, based on image data creating a base die reference (first reference die information) 104, setting parameters for inspection 105 to provide setup data 95.

The inspection parameters that govern the processing may be set automatically or changed according to the changing requirements by the end customer.

Inspection

During the inspection, an image of the current wafer is acquired. This information is compared to the reference information and by applying the required rules (defined in the setup) a result is generated. The result is reported at later stage (after verification if necessary) to factory.

Generally speaking, the reference die information is fixed for all the dice and cannot be (externally) changed (which dice to be scanned does not include the Reference Information).

In the current system, a dynamic reference generation process can be implemented. This process enables the system to define the Reference Information of each die independently, utilizing the CAD information and the CAD integration rules.

Figure 7:
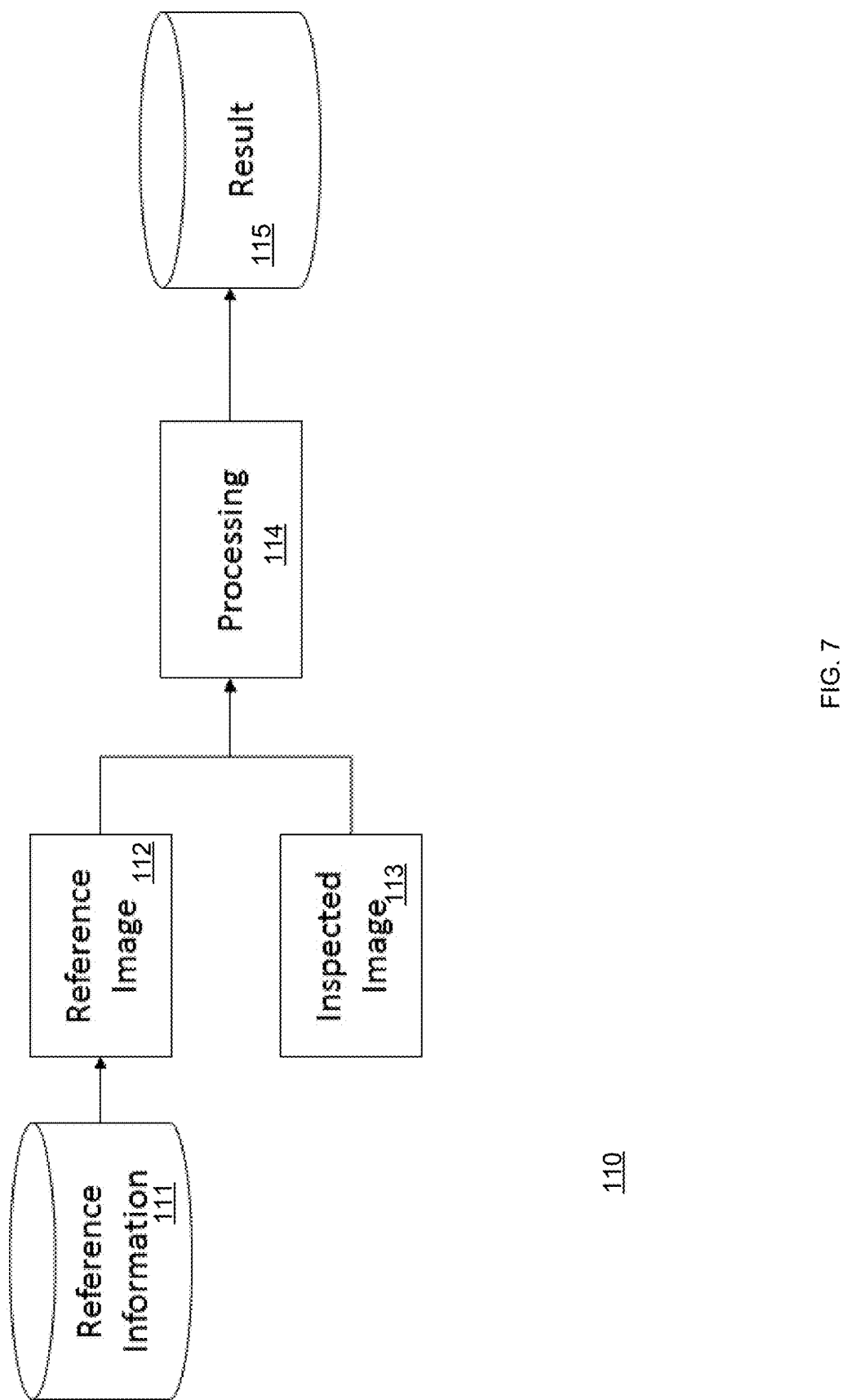
FIGS. 7 and 8 illustrate dynamic versus static die reference generation according to an embodiment of the invention.

In the static reference (see FIG. 7) each die had the reference information 111 (single die reference information to be used for each die regardless the orientation of the die)—that was defined during the setup process. The data is static and so there is no need for continuous CAD Translation during scan. The reference information 111 may also include CAD information about a single set of RDL conductors (of a single die). The reference information 111 is processed to provide a reference image 112 that is compared to an inspected image 113 (of a wafer segment) during a processing step 114 to provide an inspection result 115.

Figure 8:
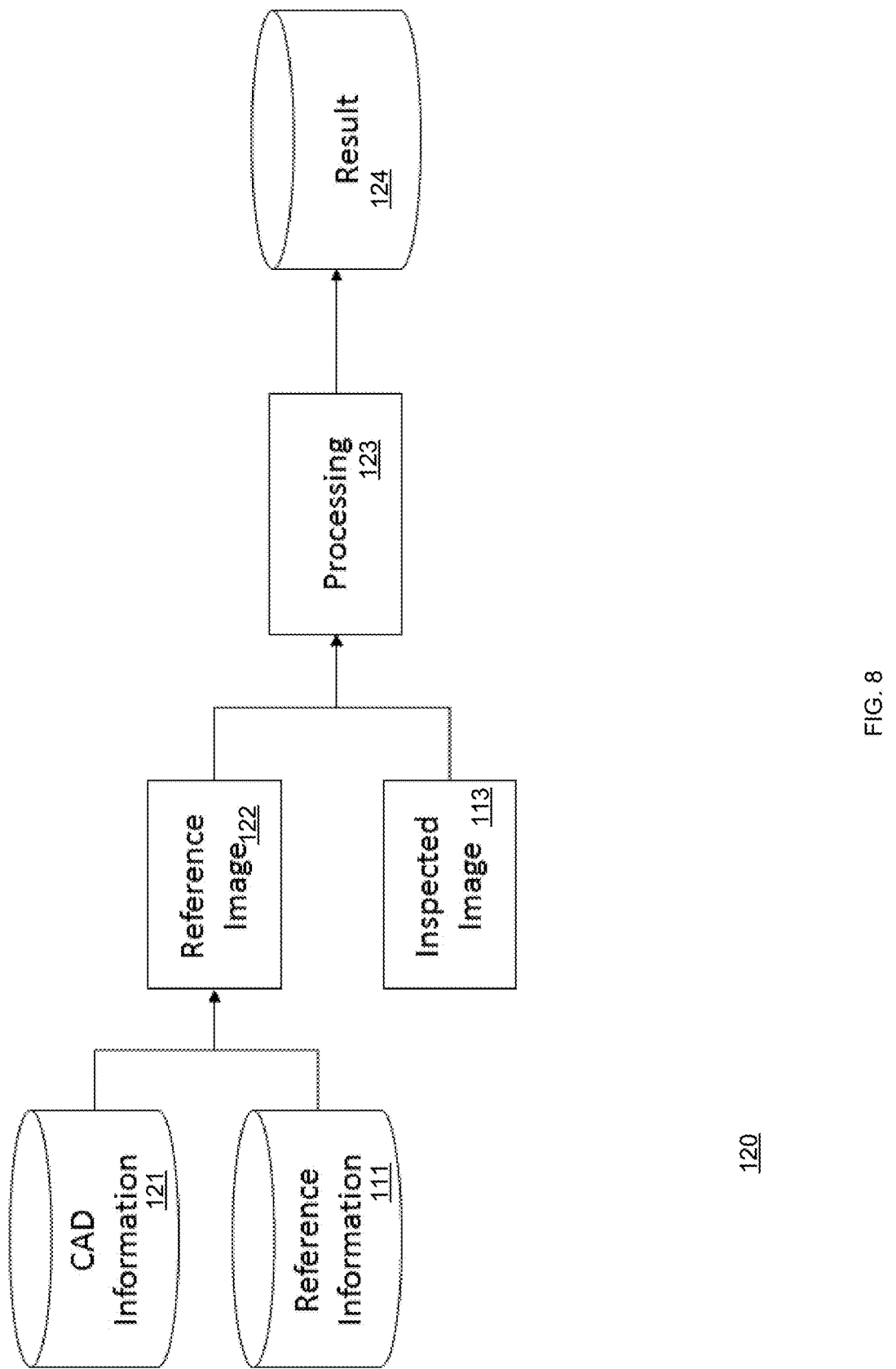

In the dynamic reference (see FIG. 8) process, as each wafer has a different structure, the CAD Information of each wafer is translated and the correct representation is created for the processing. CAD information 121 of RDL conductors of each wafer segment and reference information 111 related to the die of each wafer segment are processed (according to the orientation of the die of the wafer segment) to provide reference image 122 that is compared to an inspected image 113 (of a wafer segment) during a processing step 123 to provide an inspection result 124.

The terms "system" and "device" are used in an exchangeable manner.

Figure 9:
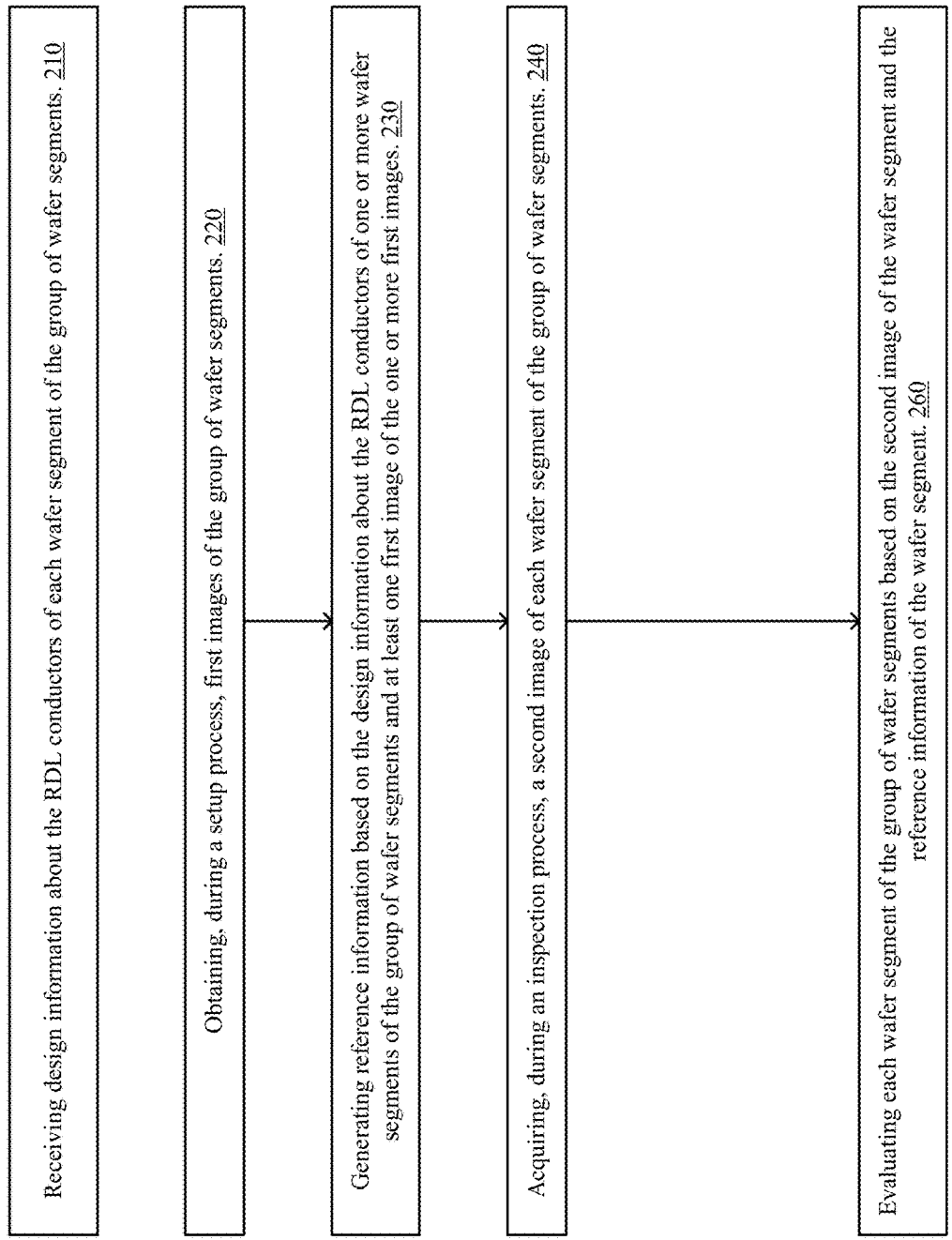
FIG. 9 illustrates a method according to an embodiment of the invention.

FIG. 9 illustrates method 200 according to an embodiment of the invention.

Method 200 is for inspecting a group of dies of a wafer. The group of dies may include one or more dies. The group of dies may include all the dies of the wafer or only a part of the dies of the wafer.

Figure 1:
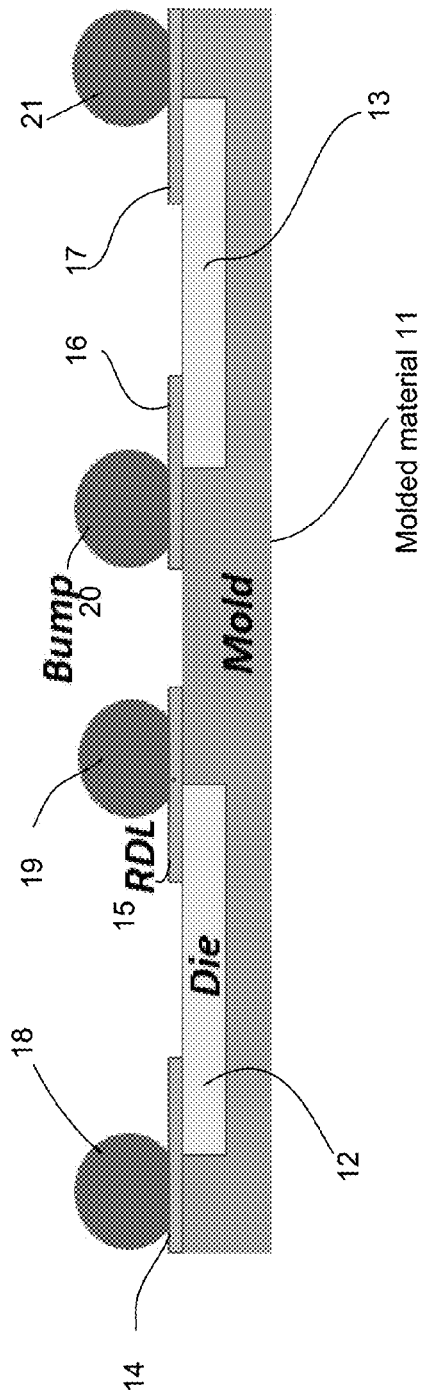
FIG. 1 illustrates a prior art Fan Out Process.

The wafer may include a group of wafer segments each wafer segment may include a die of the group of dies, a molded material that surrounds the die and redistribution layer (RDL) conductors that are coupled to the die and are positioned above the die and the molded material. A part of such a wafer is illustrated in FIGS. 1 and 2.

Method 200 may start by steps 210 and 220.

Step 210 may include receiving design information about the RDL conductors of each wafer segment of the group of wafer segments.

The design information of the RDL conductors may differ between die to die of the same wafer and may differ between dies of different wafers.

In some cases the difference may be contributed to the adjustment of the RDL conductors to the dies. A non-limiting example process of adjustment of one or more RDL conductors is illustrated in US patent application 2007/0249067 of Hedler et al which is incorporated herein by reference.

Step 210 may include selecting the relevant design information based on the identity of the wafer that is being inspected and the identity of the dies that form the group of dies.

Step 210 may include retrieving the design information about the RDL conductors of each wafer segment of the group of wafer segments out of design information about RDL conductors of different wafer segments of different wafers.

Step 210 may include converging the design information from a format in which the design information was stored to a format readable by the inspection system.

Step 220 may include obtaining, during a setup process, first images of the group of wafer segments. The obtaining of the first images may include illuminating the group of wafer segments with radiation and detecting radiation scattered or reflected from the group of wafer segments as a result of the illuminating.

The obtaining of the first images of the group of wafer segments may include obtaining one or more first images of each one of the wafer segments. A first image may include more than a single wafer segment. The illumination of the group of wafer segments may include illuminating the entire group at once, illuminating one sub-group of wafer segments at the time, illuminating only one wafer segments at a time or any manner of illumination one wafer segments. The same applies to the detection of radiation scattered or reflected from the group of wafer segments.

Step 220 may be followed by step 230 of generating reference information based on the design information about the RDL conductors of one or more wafer segments of the group of wafer segments and at least one first image of the one or more first images.

Step 230 may include generating separate reference information for each wafer segment, for all wafer segments of for each sub-group of wafer segments (that include two or more wafer segments but is smaller than the group of wafer segments).

Step 230 may include determining illumination conditions to be applied during the inspection process.

Step 230 may be followed by step 240 of acquiring, during an inspection process, second images of the group of wafer segments.

Step 240 may include obtaining of second images of the group of wafer segments. This may include obtaining one or more second images of each one of the wafer segments. A second image may include more than a single wafer segment. The illumination of the group of wafer segments may include illuminating the entire group at once, illuminating one sub-group of wafer segments at the time, illuminating only one wafer segments at a time or any manner of illumination one wafer segments. The same applies to the detection of radiation scattered or reflected from the group of wafer segments.

Step 240 may be followed by step 250 of evaluating each wafer segment of the group of wafer segments based on the second image of the wafer segment and the reference information of the wafer segment.

Step 250 may include at least one of the following:
 a. Selecting inspection parameters based on the design information about the RDL conductors of the wafer segment.
 b. Selecting a defect detection algorithm based on the design information about the RDL conductors of the wafer segment.
 c. Comparing between a second image of the wafer segment and the reference information of the wafer segment.

Orientation

Method 200 may also include processing the first images to determine an orientation of each die of the group of dies. This may include searching for fiduciary targets of the die at least one fiduciary target (such as but not limited to a via) of the die is covered by an RDL conductor.

Step 230 may include generating of the reference information in response to the orientation of the die of the wafer segment of each wafer segment.

The first die reference information may be orientation independent reference information. Accordingly—the first die reference information may be of a given orientation (aligned or not aligned with a coordinate system such as a X-Y coordinate system) and it is rotated, to fit the rotation of each die.

The first die reference information may be generated by any manner including—generated based on an image or one or more defect free dies, generated based upon one or more images of dies and defects detected in these one or more dies, may be generated based on design information of the die and the like.

Method 200 may include executing the following steps for each die: rotating the first die reference information according to the orientation of the die of the wafer segment to provide aligned die reference information; and generating the reference information by combining the aligned die reference information and the design information about RDL conductors of the wafer segment.

Method 200 may include executing the following steps for each die: rotating the orientation-independent die reference information according to the orientation of the die of the wafer segment to provide aligned die reference information; generating, based on the design information about RDL conductors of the wafer segment, an image of the RDL conductors of the wafer segment; and superimposing the image of the RDL conductors of the wafer segment on the aligned dire reference information to provide the reference information of the wafer segment.

Any reference to a system or device should be applied to a method that can be executed by the system or device or to a non-transitory computer readable medium that stores instructions that once executed by a computer causes the computer to execute the method.

Any reference to the term "comprising" or "having" should be interpreted also as referring to "consisting of" or "essentially consisting of". For example—a method that comprises certain steps can include additional steps, can be limited to the certain steps or may include additional steps that do not materially affect the basic and novel characteristics of the method—respectively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for inspecting a group of dies of a wafer, wherein the wafer comprises a group of wafer segments, wherein each wafer segment comprises a die of the group of dies, a molded material that surrounds the die and redistribution layer (RDL) conductors that are coupled to the die and are positioned above the die and the molded material, wherein the method comprises the steps of:
receiving design information about the RDL conductors of each wafer segment of the group of wafer segments;
obtaining, during a setup process, first images of the group of wafer segments;
wherein the obtaining of the first images comprises illuminating the group of wafer segments with radiation and detecting radiation scattered or reflected from the group of wafer segments as a result of the illuminating;
generating reference information based on the design information about the RDL conductors of one or more wafer segments of the group of wafer segments and at least one first image of the one or more first images;
acquiring, during an inspection process, a second image of each wafer segment of the group of wafer segments; and
evaluating each wafer segment of the group of wafer segments based on the second image of the wafer segment and the reference information of the wafer segment.

2. The method according to claim 1, comprising generating separate reference information for each wafer segment.

3. The method according to claim 1, comprising generating a single reference information for all wafer segments.

4. The method according to claim 1, comprising generating a separate reference information for each sub-group of wafer segment.

5. The method according to claim 1, wherein the evaluating comprises selecting inspection parameters based on the design information about the RDL conductors of the wafer segment.

6. The method according to claim 1, wherein the evaluating comprises selecting a defect detection algorithm based on the design information about the RDL conductors of the wafer segment.

7. The method according to claim 1, wherein the evaluating comprises comparing between a second image of the wafer segment and the reference information of the wafer segment.

8. The method according to claim 1, comprising processing the first images to determine an orientation of each die of the group of dies.

9. The method according to claim 8, wherein the generating of the reference information is responsive to the orientation of the die of the wafer segment of each wafer segment.

10. An inspection system for inspecting a group of dies of a wafer, wherein the wafer comprises a group of wafer segments, wherein each wafer segment comprises a die of the group of dies, a molded material that surrounds the die and redistribution layer (RDL) conductors that are coupled to the die and are positioned above the die and the molded material, wherein the inspection system comprises:
a design information unit for receiving design information about the RDL conductors of each wafer segment of the group of wafer segments;
an imaging device that is configured to obtain, during a setup process, first images of the group of wafer segments; wherein the obtaining of the first images comprises illuminating the group of wafer segments with radiation and detecting radiation scattered or reflected from the group of wafer segments as a result of the illuminating;
a processing system that is configured to generate reference information based on the design information about the RDL conductors of one or more wafer segments of the group of wafer segments and at least one first image of the one or more first images;
wherein the imaging device is further configured to acquire, during an inspection process, second images of the group of wafer segments; and
wherein the processing system is further configured to evaluate each wafer segment of the group of wafer segments based on the second image of the wafer segment and the reference information of the wafer segment.

11. A non-transitory computer readable medium that stores instructions that once executed by an inspection system causes the inspection system to inspect a group of dies of a wafer, wherein the wafer comprises a group of wafer segments, wherein each wafer segment comprises a die of the group of dies, a molded material that surrounds the die and redistribution layer (RDL) conductors that are coupled to the die and are positioned above the die and the molded material, by executing the steps of:
receiving design information about the RDL conductors of each wafer segment of the group of wafer segments;
obtaining, during a setup process, first images of the group of wafer segments;
wherein the obtaining of the first images comprises illuminating the group of wafer segments with radiation and detecting radiation scattered or reflected from the group of wafer segments as a result of the illuminating;
generating reference information based on the design information about the RDL conductors of one or more wafer segments of the group of wafer segments and at least one first image of the one or more first images;
acquiring, during an inspection process, a second image of each wafer segment of the group of wafer segments; and
evaluating each wafer segment of the group of wafer segments based on the second image of the wafer segment and the reference information of the wafer segment.

12. The non-transitory computer readable medium according to claim 11, that stores instructions for generating separate reference information for each wafer segment.

13. The non-transitory computer readable medium according to claim 11, that stores instructions for generating a single reference information for all wafer segments.

14. The non-transitory computer readable medium according to claim 11, that stores instructions for generating a separate reference information for each sub-group of wafer segment.

15. The non-transitory computer readable medium according to claim 11, wherein the evaluating comprises selecting inspection parameters based on the design information about the RDL conductors of the wafer segment.

16. The non-transitory computer readable medium according to claim 11, wherein the evaluating comprises selecting a defect detection algorithm based on the design information about the RDL conductors of the wafer segment.

17. The non-transitory computer readable medium according to claim 11, wherein the evaluating comprises comparing between a second image of the wafer segment and the reference information of the wafer segment.

18. The non-transitory computer readable medium according to claim 11, that stores instructions for processing the first images to determine an orientation of each die of the group of dies.

19. The non-transitory computer readable medium according to claim 18, wherein the generating of the reference information is responsive to the orientation of the die of the wafer segment of each wafer segment.

* * * * *